(12) United States Patent
Healy et al.

(10) Patent No.: US 10,283,212 B2
(45) Date of Patent: May 7, 2019

(54) BUILT-IN SELF-TEST FOR EMBEDDED SPIN-TRANSFER TORQUE MAGNETIC RANDOM ACCESS MEMORY

(71) Applicant: INTERNATIONAL BUSINESS MACHINES CORPORATION, Armonk, NY (US)

(72) Inventors: Michael B. Healy, Cortlandt Manor, NY (US); Hillery C. Hunter, Chappaqua, NY (US); Janani Mukundan, Austin, TX (US); Karthick Rajamani, Austin, TX (US); Saravanan Sethuraman, Bangalore (IN)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 19 days.

(21) Appl. No.: 15/362,935

(22) Filed: Nov. 29, 2016

(65) Prior Publication Data

US 2018/0151246 A1    May 31, 2018

(51) Int. Cl.
*G11C 29/12* (2006.01)
*G11C 29/50* (2006.01)
(Continued)

(52) U.S. Cl.
CPC .......... *G11C 29/12* (2013.01); *G11C 14/0036* (2013.01); *G11C 29/12005* (2013.01);
(Continued)

(58) Field of Classification Search
CPC .............. G11C 29/12; G11C 29/12005; G11C 11/1673; G11C 11/1675;
(Continued)

(56) References Cited

U.S. PATENT DOCUMENTS 6,400,600 B1    6/2002 Nickel et al.
6,778,432 B2    8/2004 Ohtani
(Continued)

OTHER PUBLICATIONS

Alfredo Benso, et al., "An on-line BIST RAM architecture with selfrepair capabilities", IEEE Transaction on Reliability, ResearchGate, Apr. 2002, p. 1-7.

(Continued)

*Primary Examiner* — John J Tabone, Jr.
(74) *Attorney, Agent, or Firm* — Cantor Colburn LLP; Bryan Bortnick

(57) ABSTRACT

Examples of techniques for a built-in self-test (BIST) for embedded spin-transfer torque magnetic random access memory (STT-MRAM) are disclosed. In one example implementation according to aspects of the present disclosure, a computer-implemented method may include: initiating, by a processor, a BIST for the STT-MRAM; performing, by the processor, an error-correcting code (ECC) test for a portion of the STT-MRAM; responsive to the ECC test not being passed, determining whether a maximum signal is reached; responsive to the maximum signal not being reached, increasing the signal and performing the ECC test again; and responsive to the maximum signal being reached, determining that the portion of the STT-MRAM is bad.

17 Claims, 4 Drawing Sheets

(51) Int. Cl.
*G11C 29/52* (2006.01)
*G11C 14/00* (2006.01)
*G11C 11/16* (2006.01)
*G11C 29/04* (2006.01)

(52) U.S. Cl.
CPC .. *G11C 29/50004* (2013.01); *G11C 29/50012* (2013.01); *G11C 29/52* (2013.01); *G11C 11/1673* (2013.01); *G11C 11/1675* (2013.01); *G11C 2029/0401* (2013.01); *G11C 2029/5004* (2013.01)

(58) Field of Classification Search
CPC ........ G11C 2029/0401; G11C 14/0036; G11C 29/52; G11C 29/5004; G11C 29/50012; G11C 2029/5004
USPC .................. 714/718, 721, 723; 365/200, 201
See application file for complete search history.

(56) References Cited

U.S. PATENT DOCUMENTS

| | | | |
|---|---|---|---|
| 7,493,531 B2 | 2/2009 | Ito et al. | |
| 8,054,678 B2 | 11/2011 | Wang et al. | |
| 8,638,596 B2 | 1/2014 | Kim et al. | |
| 8,929,167 B2 | 1/2015 | Kim | |
| 9,026,867 B1 | 5/2015 | Northcott et al. | |
| 9,058,869 B2 | 6/2015 | Patapoutian et al. | |
| 9,069,719 B2 | 6/2015 | Ong | |
| 9,734,885 B1* | 8/2017 | Healy | G11C 11/1675 |
| 9,766,973 B2* | 9/2017 | Choi | G06F 11/1048 |
| 9,786,388 B1* | 10/2017 | Nassie | G11C 29/56008 |
| 9,934,086 B2* | 4/2018 | Laity | G11C 29/52 |
| 9,953,725 B2* | 4/2018 | Ryu | G11C 29/44 |
| 2005/0223251 A1* | 10/2005 | Liepe | H03K 19/0008 |
| | | | 713/322 |
| 2011/0179321 A1* | 7/2011 | Takeuchi | G11C 29/50 |
| | | | 714/718 |
| 2013/0173970 A1* | 7/2013 | Kleveland | G11C 29/44 |
| | | | 714/710 |
| 2014/0157065 A1* | 6/2014 | Ong | G11C 29/12 |
| | | | 714/718 |
| 2014/0211551 A1* | 7/2014 | Kim | G11C 29/4401 |
| | | | 365/158 |
| 2015/0149873 A1* | 5/2015 | Cai | H03M 13/458 |
| | | | 714/773 |
| 2016/0034349 A1* | 2/2016 | Choi | G11C 11/5642 |
| | | | 714/764 |
| 2016/0064058 A1 | 3/2016 | Janesky et al. | |
| 2016/0125959 A1* | 5/2016 | Otterstedt | G11C 29/50016 |
| | | | 365/201 |
| 2016/0132256 A1* | 5/2016 | Jung | G06F 3/0614 |
| | | | 711/103 |
| 2016/0232985 A1* | 8/2016 | Sabde | G11C 29/50 |
| 2017/0048072 A1* | 2/2017 | Cambou | H04L 9/3278 |
| 2017/0110206 A1* | 4/2017 | Ryu | G11C 29/44 |

OTHER PUBLICATIONS

Brandon Del Bel, et al.,"Improving STT-MRAM Density Through Multibit Error Correction", Proceeding of the conference on Design, Automation & test in Europe, Article No. 182, 2014, p. 1-6.

Soha Pajouhi, et al.,"Yeild, Area and Energy Optimization in STT-MRAMS Using Failureaware ECC"AMC Transaction, JetC journal, Jun. 16, 2016, p. 1-19.

* cited by examiner

BUILT-IN SELF-TEST FOR EMBEDDED SPIN-TRANSFER TORQUE MAGNETIC RANDOM ACCESS MEMORY

BACKGROUND

The present disclosure generally relates to memory for a computer processing system and, more particularly, relates to a built-in self-test (BIST) for embedded spin-transfer torque magnetic random access memory (STT-MRAM).

Spin-transfer torque magnetic random access memory has emerged as a leading candidate for next-generation memory for L2/L3 cache and DRAM replacement. Due to its great scalability, rapid access speed, low power consumption and non-volatility, it has attracted increasing attention in the semiconductor industry. Like all semiconductor products, STT-MRAM chips need to undergo intensive electrical tests to identify and eliminate defective chips and provide improved outgoing product quality to customers. Whereas testing conventional memories is a mature field, little is known about testing STT-MRAMs. Having a sound test approach for STT-MRAMs is useful for industrial adoption.

SUMMARY

According to examples of the present disclosure, techniques including methods, systems, and/or computer program products for a built-in self-test (BIST) for embedded spin-transfer torque magnetic random access memory (STT-MRAM) are provided. An example method may include initiating, by a processor, a BIST for the STT-MRAM. The method may further include performing, by the processor, an error-correcting code (ECC) test for a portion of the STT-MRAM. The method may further include responsive to the ECC test not being passed, determining whether a maximum signal is reached. The method may further include, responsive to the maximum signal not being reached, increasing the signal and performing the ECC test again. The method may further include, responsive to the maximum signal being reached, determining that the portion of the STT-MRAM is bad.

Additional features and advantages are realized through the techniques of the present disclosure. Other aspects are described in detail herein and are considered a part of the disclosure. For a better understanding of the present disclosure with the advantages and the features, refer to the following description and to the drawings.

BRIEF DESCRIPTION OF THE DRAWINGS

The subject matter which is regarded as the invention is particularly pointed out and distinctly claimed in the claims at the conclusion of the specification. The foregoing and other features, and advantages thereof, are apparent from the following detailed description taken in conjunction with the accompanying drawings in which:

DETAILED DESCRIPTION

Figure 1:
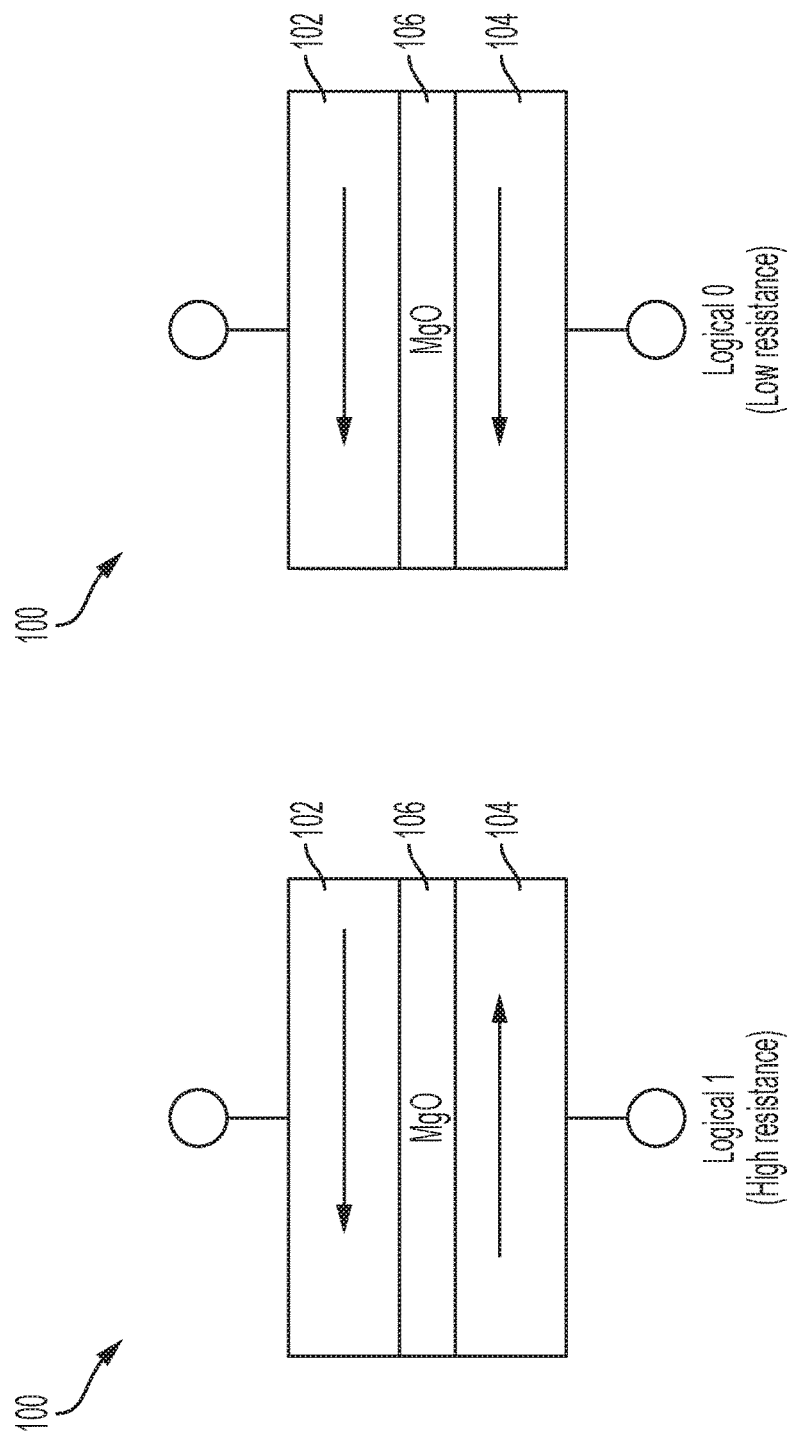
FIGS. 1A and 1B illustrate a block diagram of an example of a spin-transfer torque-magnetic random access memory cell 100 according to aspects of the present disclosure.

Various implementations are described below by referring to several examples of a built-in self-test (BIST) for embedded spin-transfer torque magnetic random access memory (STT-MRAM).

STT-MRAM chips may suffer from bad or damaged cells. In such cases, the cell structure may be bad, does not contain enough magnesium oxide, and/or experience a manufacturing defect. As a result, the cell may be stuck at high or low. For cells stuck at high, no effect on the cell occurs even when a large write current is applied. For cells stuck at low, no effect on the cell occurs when a write pulse is applied to the cell. Additionally, a cell may experience fluctuating cell behavior because of a weak cell in nature or thermal stability issues. This causes runtime parametric variation problems for the cell because of the material behavior. In addition, write bit error rates (BER) problems may occur.

The presently disclosed techniques provide an improvement to the reliability of STT-MRAM chips. In particular, the present techniques provide a strong STT-MRAM memory controller with features to support unreliable STT-MRAM chips. The proposed memory controller uses variable write pulse width and variable input/output (I/O) bit current as part of a BIST process to identify errors. This enables the memory controller to identify failed bits in a row or a damaged row based on the write BER.

In particular, a variable time pulse width (tPW) and a variable write current (Iwr) for example can be applied to a weaker cell in a row and the results can be analyzed to identify issues. The issues can be consolidated in a lookup table or stored in at the end of chip sorting or the DIMM qualification. If the same address is invoked during a real-time workload, then the memory uses the lookup table settings for the tPW and Iwr to maximize the write/read operations (apart from BIST).

The present techniques also provide an enable/disable function. In one example, if 1-5% of cells are bad in a row/chip and/or a particular BER threshold is reached, then a variable pulse/variable current technique can be used to determine whether the failure is real. This also enables a determination of whether the dynamic variations to pulse and current improves the write BER. The present techniques can be applied in the wafer, after stacking (in the case of 3D stacking) testing, or while the system is running.

Example embodiments of the disclosure include or yield various technical features, technical effects, and/or improvements to technology. Example embodiments of the disclosure are effective for main memories and also for embedded memories (e.g., STT-RAM based cache architecture). Example embodiments also improve bit rate errors over a period of time by varying parameters based on the current scenario. The present techniques also improve yield while testing a memory wafer/stack. For example, based on the material type, the present techniques implement the particular tPW and/or Iwr to ensure the memory DIMMs are reliable and usable. Further, the present techniques provide a new BIST controller and similar memory controller designs to handle unreliable non-volatile memories such as STT-MRAM and PCM where there is long write latency and where reliability is a concern based on material and other factors. As a result of these technical features and technical effects, a STT-MRAM-based system in accordance with example embodiments of the disclosure represents an improvement to existing memory techniques. It should be appreciated that the above examples of technical features, technical effects, and improvements to technology of example embodiments of the disclosure are merely illustrative and not exhaustive.

FIGS. 1A and 1B illustrate block diagrams of an example of a spin-transfer torque-magnetic random access memory (STT-MRAM) cell 100 according to aspects of the present disclosure. STT-RAM is a new generation of Magnetic Random Access Memory (MRAM). A STT-RAM cell uses Magnetic Tunnel Junction (MTJ) to store binary data using directionality of a free layer 104 with respect to a reference layer 102. The free layer 104 and the reference layer 102 are separated by a barrier layer 106, such as magnesium oxide. When the magnetic field of the free layer 104 and the reference layer 102 are parallel (see FIG. 1B), the MTJ resistance is low representing a logical "0." When these two layers are in anti-parallel direction (see FIG. 1A), the MTJ resistance is high which represents a logical "1." STT-MRAM considered to an alternative to dynamic random access memory (DRAM).

The critical current ($I_{c0}$) is the minimum current needed to switch the magnetic alignment of the free layer 104 in the MTJ. The critical current density ($J_{c0}$) is the minimum current per unit area required to switch the magnetic alignment of the free layer in the MTJ. Reducing the critical current density serves a few purposes. First, it allows for a lower overall power usage in read and write operations. Secondly, it enables for a larger ratio between the critical current and the operational current, which will reduce the write BER and read disturb BER based on the following formula:

$$I_{c0}(\tau) = A * J_{c0} * \left(1 + \frac{1}{\Delta}\ln\left(\frac{\tau}{\tau_0}\right)\right)$$

where 'A' is the planar area of the free layer, '$J_{c0}$' is the critical current density, '$\Delta$' is the thermal stability factor, '$\tau$' is the pulse width (the write time), and '$\tau_0$' is the intrinsic attempt time (e.g., one nanosecond). For an MTJ with a fixed area, it is most viable to lower the critical current density in order to lower the critical current.

Figure 2:
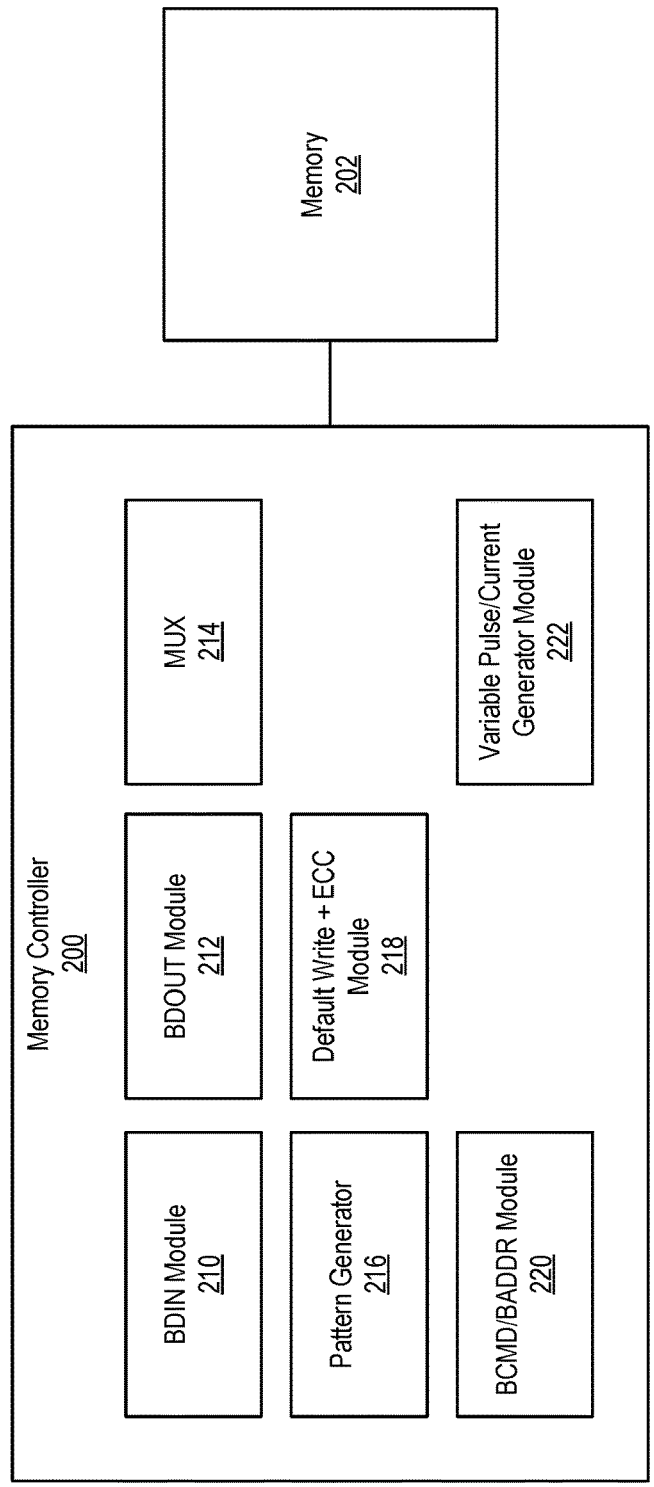
FIG. 2 illustrates a block diagram of a memory controller for a built-in self-test for embedded spin-transfer torque magnetic random access memory according to examples of the present disclosure.

FIG. 2 illustrates a block diagram of a memory controller 200 for a built-in self-test (BIST) for embedded spin-transfer torque magnetic random access memory (STT-MRAM) 202 according to examples of the present disclosure. The various components, modules, engines, etc. described regarding FIG. 2 may be implemented as instructions stored on a computer-readable storage medium, as hardware modules, as special-purpose hardware (e.g., application specific hardware, application specific integrated circuits (ASICs), as embedded controllers, hardwired circuitry, etc.), or as some combination or combinations of these. In examples, the engine(s) described herein may be a combination of hardware and programming. The programming may be processor executable instructions stored on a tangible memory, and the hardware may include a processing device for executing those instructions. Thus a system memory can store program instructions that when executed by the processing device implement the engines described herein. Other engines may also be utilized to include other features and functionality described in other examples herein.

The memory controller 200 may include a BIST to data in (BDIN) module 210, a BIST to data out (BDOUT) module 212, a multiplexer 214, a pattern generator 216, a default write+ECC module 218, a BIST command/address (BCMD/BADDR module) 220, and a variable pulse/current generator module 222. Alternatively or additionally, the memory controller 200 may include dedicated hardware, such as one or more integrated circuits, Application Specific Integrated Circuits (ASICs), Application Specific Special Processors (ASSPs), Field Programmable Gate Arrays (FPGAs), or any combination of the foregoing examples of dedicated hardware, for performing the techniques described herein.

The BDIN module 210 performs a built-in self-test on the memory 202 for inbound (write) data. For example, the BDIN module 210 applies a time pulse width to a cell (or a row of cells) of the memory 202 to determine whether the cell (or a row of cells) is bad for reading data.

The BDOUT module 212 performs a built-in self-test on the memory 202 for outbound (read) data. For example, the BDOUT module 212 applies a current to a cell (or a row of cells) of the memory 202 to determine whether the cell (or a row of cells) is bad for writing data.

The multiplexer 214 may represent one or more multiplexers to MUX the time pulse width or the current from the BDIN module 210 and the BDOUT module 212. The multiplexer 214 (or another multiplexer, not shown) may MUX a BIST command or a BIST address from the BCMD/BADDR Module 220 to cause either the variable pulse/current generator module 222 to generate a variable pulse or current to test the memory 202 or to cause the default write+ECC module 218 to generate a fixed (i.e., default) pulse or current. The pattern generator 216 generates a pattern, such as 00, 01, 10, 11. The patterns can be used to read/write test data to the memory 202.

Figure 3:
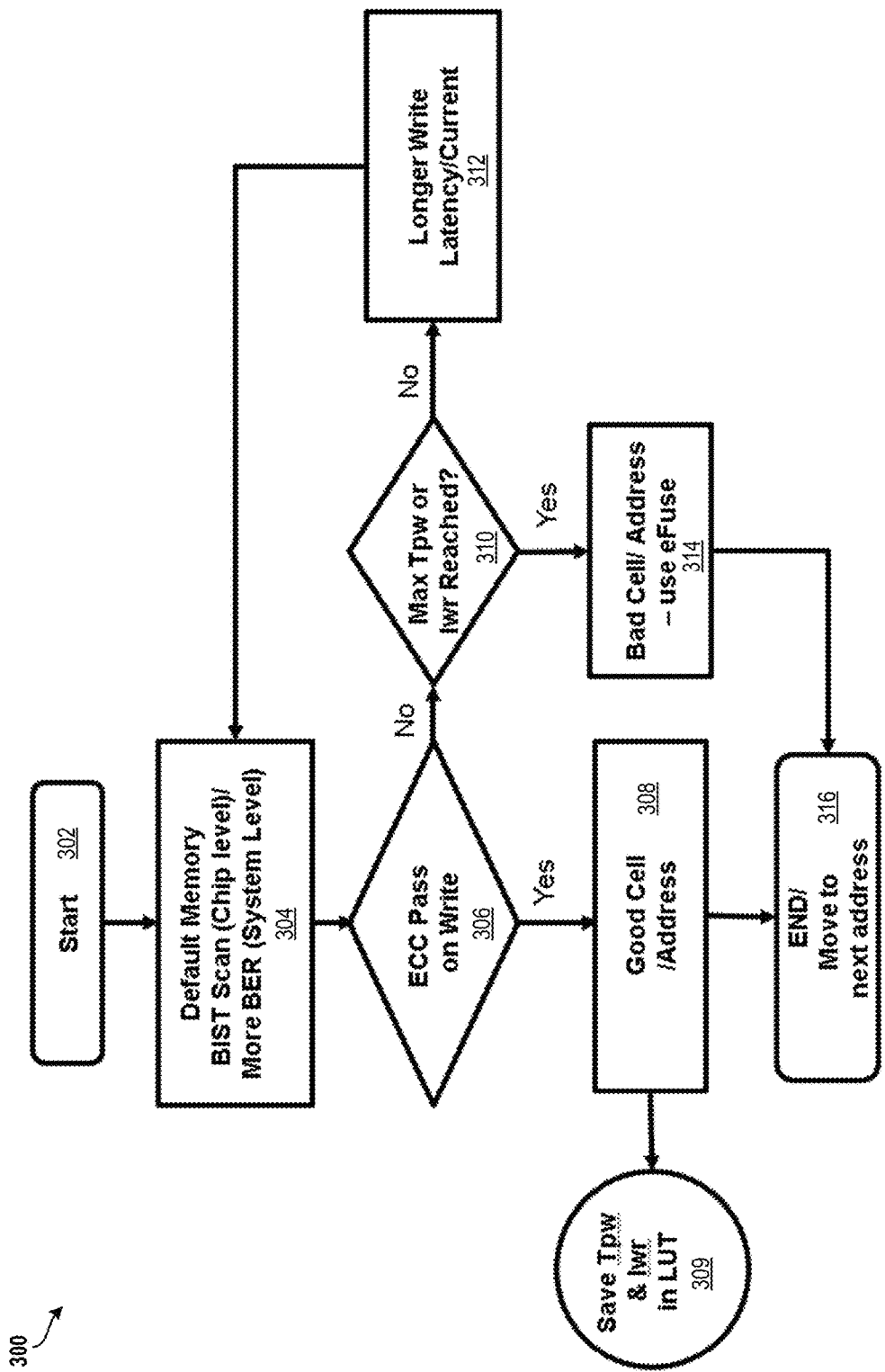
FIG. 3 illustrates a flow diagram of a method for a built-in self-test for embedded spin-transfer torque magnetic random access memory according to examples of the present disclosure.

FIG. 3 illustrates a flow diagram of a method 300 for a built-in self-test (BIST) for embedded spin-transfer torque magnetic random access memory (STT-MRAM) according to examples of the present disclosure. The method 300 may be performed, for example, by a processing system, such as the processing system 20 of FIG. 4, or by a memory controller, such as the memory controller 200 of FIG. 2.

The method 300 starts at block 302 and continues to block 304. At block 304, the method 300 includes performing a default memory built-in self-test (BIST). The BIST may be performed at the system level, at the chip level, at the cell lever, etc. At decision block 306, the method includes determining whether an error-correcting code (ECC) test is passed, such as for a write (or a read). If the ECC test is passed at decision block 306, the method 300 continues to block 308 and it is determined that the portion of the memory that is being tested is good. The address, along with the pulse or current used to test the cell is saved to a data store at block 309, and the method 300 proceeds to block 316 and ends or returns to test the next address/portion of the memory at block 304.

If, at decision block 306, it is determined that the ECC test is not passed, the method 300 continues to decision block 310. At decision block 310, it is determined whether a maximum pulse (tPW) or current (Iwr) is reached. If not, the method 300 continues to block 312, and the pulse or current is increased and the BIST starts again at block 304. If, however, at decision block 310, the maximum pulse or current is reached, the portion of the memory being tested is determined to be bad at block 314. The memory address may be stored to a data store in examples to prevent the bad portion of the memory from being used. The method 300 proceeds to block 316 and ends or returns to test the next address/portion of the memory at block 304.

Additional processes also may be included, and it should be understood that the processes depicted in FIG. 3 represent illustrations, and that other processes may be added or existing processes may be removed, modified, or rearranged without departing from the scope and spirit of the present disclosure.

Figure 4:
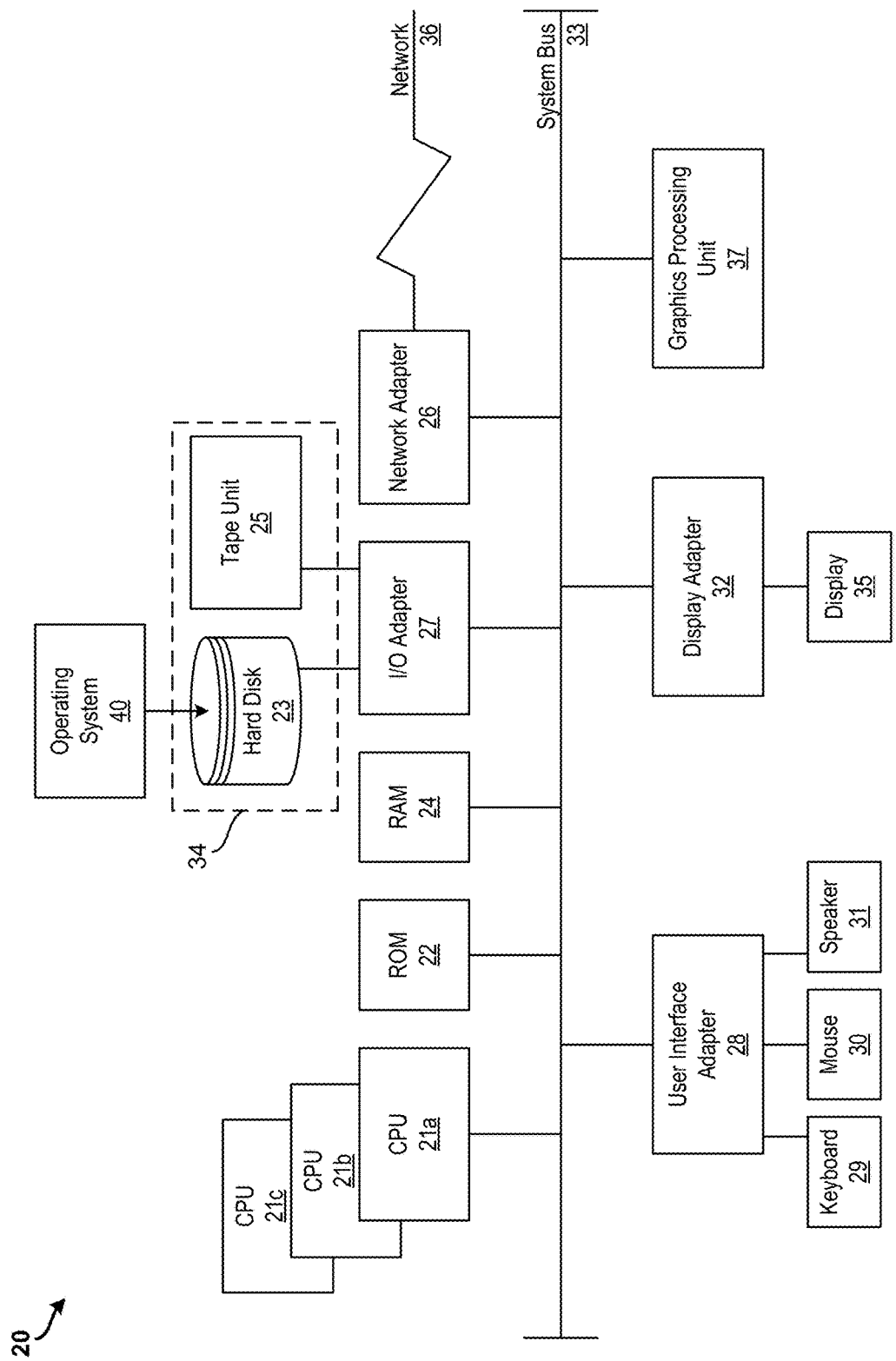
FIG. 4 illustrates a block diagram of a processing system for implementing the techniques described herein according to examples of the present disclosure.

It is understood in advance that the present disclosure is capable of being implemented in conjunction with any other type of computing environment now known or later developed. For example, FIG. 4 illustrates a block diagram of a processing system 20 for implementing the techniques described herein. In examples, processing system 20 has one or more central processing units (processors) 21a, 21b, 21c, etc. (collectively or generically referred to as processor(s) 21 and/or as processing device(s)). In aspects of the present disclosure, each processor 21 may include a reduced instruction set computer (RISC) microprocessor. Processors 21 are coupled to system memory (e.g., random access memory (RAM) 24) and various other components via a system bus 33. Read only memory (ROM) 22 is coupled to system bus 33 and may include a basic input/output system (BIOS), which controls certain basic functions of processing system 20.

Further illustrated are an input/output (I/O) adapter 27 and a communications adapter 26 coupled to system bus 33. I/O adapter 27 may be a small computer system interface (SCSI) adapter that communicates with a hard disk 23 and/or a tape storage drive 25 or any other similar component. I/O adapter 27, hard disk 23, and tape storage device 25 are collectively referred to herein as mass storage 34. Operating system 40 for execution on processing system 20 may be stored in mass storage 34. A network adapter 26 interconnects system bus 33 with an outside network 36 enabling processing system 20 to communicate with other such systems.

A display (e.g., a display monitor) 35 is connected to system bus 33 by display adaptor 32, which may include a graphics adapter to improve the performance of graphics intensive applications and a video controller. In one aspect of the present disclosure, adapters 26, 27, and/or 32 may be connected to one or more I/O busses that are connected to system bus 33 via an intermediate bus bridge (not shown). Suitable I/O buses for connecting peripheral devices such as hard disk controllers, network adapters, and graphics adapters typically include common protocols, such as the Peripheral Component Interconnect (PCI). Additional input/output devices are shown as connected to system bus 33 via user interface adapter 28 and display adapter 32. A keyboard 29, mouse 30, and speaker 31 may be interconnected to system bus 33 via user interface adapter 28, which may include, for example, a Super I/O chip integrating multiple device adapters into a single integrated circuit.

In some aspects of the present disclosure, processing system 20 includes a graphics processing unit 37. Graphics processing unit 37 is a specialized electronic circuit designed to manipulate and alter memory to accelerate the creation of images in a frame buffer intended for output to a display. In general, graphics processing unit 37 is very efficient at manipulating computer graphics and image processing, and has a highly parallel structure that makes it more effective than general-purpose CPUs for algorithms where processing of large blocks of data is done in parallel.

Thus, as configured herein, processing system 20 includes processing capability in the form of processors 21, storage capability including system memory (e.g., RAM 24), and mass storage 34, input means such as keyboard 29 and mouse 30, and output capability including speaker 31 and display 35. In some aspects of the present disclosure, a portion of system memory (e.g., RAM 24) and mass storage 34 collectively store an operating system such as the AIX® operating system from IBM Corporation to coordinate the functions of the various components shown in processing system 20.

The present techniques may be implemented as a system, a method, and/or a computer program product. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some examples, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to aspects of the present disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the figures illustrate the architecture, functionality, and operation of possible implementations of systems, methods, and computer program products according to various aspects of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various examples of the present disclosure have been presented for purposes of illustration, but are not intended to be exhaustive or limited to the embodiments disclosed. Many modifications and variations will be apparent to those of ordinary skill in the art without departing from the scope and spirit of the described techniques. The terminology used herein was chosen to best explain the principles of the present techniques, the practical application or technical improvement over technologies found in the marketplace, or to enable others of ordinary skill in the art to understand the techniques disclosed herein.

What is claimed is:

1. A computer-implemented method for a built-in self-test (BIST) for embedded spin-transfer torque magnetic random access memory (STT-MRAM), the method comprising:
    initiating, by a processor, a BIST that includes an error-correcting code (ECC) test for the STT-MRAM;
    performing, by the processor, the ECC test for a portion of the STT-MRAM;
    responsive to the ECC test not being passed, determining whether at least one of a maximum pulse and a maximum current is reached;
    responsive to the at least one of the maximum pulse and the maximum current not being reached, increasing the at least one of the maximum pulse and the maximum current and performing the ECC test again; and
    responsive to the at least one of the maximum pulse and the maximum current being reached, determining that the portion of the STT-MRAM is bad.

2. The computer-implemented method of claim 1, wherein the maximum pulse is applied for a read command.

3. The computer-implemented method of claim 2, further comprising storing a pulse value that results in a correct functioning of a cell of the STT-MRAM.

4. The computer-implemented method of claim 3, further comprising applying the pulse value during a normal operation of the cell of the STT-MRAM to enable continued correct functioning of the cell of the STT-MRAM.

5. The computer-implemented method of claim 1, wherein the maximum current is applied for a write command.

6. The computer-implemented method of claim 5, further comprising storing a current value that results in a correct functioning of a cell of the STT-MRAM.

7. The computer-implemented method of claim 6, further comprising applying the current value during a normal operation of the cell of the STT-MRAM to enable continued correct functioning of the cell of the STT-MRAM.

8. The computer-implemented method of claim 1, further comprising, responsive to the ECC test being passed, determining that the portion of the STT-MRAM is good.

9. The computer-implemented method of claim 8, further comprising, responsive to determining that the portion of the STT-MRAM is good, saving an address corresponding to the portion of the STT-MRAM as being a good address.

10. The computer-implemented method of claim 1, further comprising, responsive to determining that the portion of the STT-MRAM is bad, saving an address corresponding to the portion of the STT-MRAM as being a bad address.

11. A system for a built-in self-test (BIST) for embedded spin-transfer torque magnetic random access memory (STT-MRAM), the system comprising:
    a memory comprising computer readable instructions; and
    a processing device for executing the computer readable instructions for performing a method, the method comprising:

initiating, by the processing device, a BIST that includes an error-correcting code (ECC) test for the STT-MRAM;

performing, by the processing device, the ECC test for a portion of the STT-MRAM;

responsive to the ECC test not being passed, determining whether at least one of a maximum pulse and a maximum current is reached;

responsive to the at least one of the maximum pulse and the maximum current not being reached, increasing the at least one of the maximum pulse and the maximum current and performing the ECC test again; and responsive to the at least one of the maximum pulse and the maximum current being reached, determining that the portion of the STT-MRAM is bad.

12. The system of claim 11, wherein the maximum pulse is applied for a read command.

13. The system of claim 11, wherein the maximum current is applied for a write command.

14. The system of claim 11, the method further comprising, responsive to the ECC test being passed, determining that the portion of the STT-MRAM is good.

15. The system of claim 14, the method further comprising, responsive to determining that the portion of the STT-MRAM is good, saving an address corresponding to the portion of the STT-MRAM as being a good address.

16. The system of claim 11, the method further comprising, responsive to determining that the portion of the STT-MRAM is bad, saving an address corresponding to the portion of the STT-MRAM as being a bad address.

17. A computer program product for a built-in self-test (BIST) for embedded spin-transfer torque magnetic random access memory (STT-MRAM), the computer program product comprising:

a computer readable storage medium having program instructions embodied therewith, wherein the computer readable storage medium is not a transitory signal per se, the program instructions executable by a processing device to cause the processing device to perform a method comprising:

initiating, by the processing device, a BIST that includes an error-correcting code (ECC) test for the STT-MRAM;

performing, by the processing device, the ECC test for a portion of the STT-MRAM;

responsive to the ECC test not being passed, determining whether at least one of a maximum pulse and a maximum current is reached;

responsive to the at least one of the maximum pulse and the maximum current not being reached, increasing the at least one of the maximum pulse and the maximum current and performing the ECC test again; and responsive to the at least one of the maximum pulse and the maximum current being reached, determining that the portion of the STT-MRAM is bad.

\* \* \* \* \*